Inventor:
Robert L. Watters,
by Merton D. Morse
His Attorney.

FEEDBACK AMPLIFIER

Filed June 24, 1946 2 SHEETS--SHEET 2

Inventor:
Robert L. Watters,
by Merton D. Moore
His Attorney.

Patented Oct. 30, 1951 2,573,523

UNITED STATES PATENT OFFICE 2,573,523

FEEDBACK AMPLIFIER

Robert L. Watters, Schenectady, N. Y., assignor to General Electric Company, a corporation of New York Application June 24, 1946, Serial No. 678,788

12 Claims. (Cl. 179—171)

Figure 1:
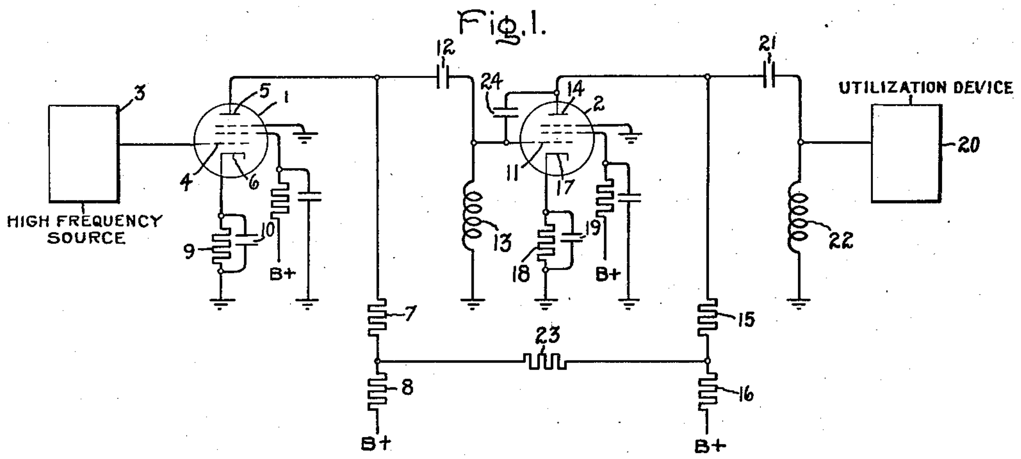

This invention relates to electronic amplifiers and particularly to intermediate frequency amplifiers for operation within narrow bands at high frequencies and which have flat-topped voltage-frequency characteristics within their bands of operation.

In certain types of electronic systems it is desirable to provide amplifiers which have flat-topped voltage-frequency characteristics; for example, such amplifiers when used as intermediate frequency amplifiers will allow some deviation between transmitter and local oscillator frequencies without affecting the over-all gain of the system. One type of amplifier suitable for use when the frequency pass band is relatively broad comprises first and second stage electron discharge devices with single tuned output circuits and a feedback resistor connected directly between the anodes of the two devices to supply negative feedback in the second stage and produce the flat-topped characteristics. A series of these single tuned pairs of amplifier stages may be provided, it being understood that each feedback stage in such series is separated from the rest by a conventional amplifier stage; this makes the amplifier unidirectional and eliminates reflected wave effects. This amplifier has been found entirely satisfactory for operation within relatively wide pass bands; however, when the amount of feedback is adjusted to secure narrow band width operation by increasing the value of the feedback resistor, the value of the feedback resistor becomes of the same order of magnitude as the stray capacitive reactance of the feedback path and associated circuits and the amplifier becomes unstable. Accordingly it is an object of this invention to provide an improved single tuned negative feedback amplifier having a flat-topped voltage-frequency characteristic and suitable for operation at high frequencies within a narrow pass band.

It is another object of this invention to provide an improved negative feedback amplifier for operation within a narrow pass band at high frequencies which shall be stable throughout its range of operation.

The novel features which are believed to be characteristic of this invention are set forth with particularity in the appended claims. The invention itself, however, both as to its organization and method of operation, together with further objects and advantages thereof, may best be understood by reference to the following description taken in connection with the accompanying drawing, in which Fig. 1 represents one embodiment of the invention, Fig. 2 illustrates the voltage-frequency characteristic of the amplifier shown in Fig. 1, Fig. 3 represents a second embodiment of the invention, and Fig. 4 a third embodiment.

Briefly the amplifier illustrated in the drawing comprises pairs of single tuned electronic amplifier stages, the second stage being provided with a negative feedback path to produce a flat-topped or "double-humped" voltage-frequency characteristic. The feedback is selected to secure narrow width pass band operation and the feedback network is arranged to provide a high current, low voltage, non-frequency responsive feedback path, the distributed capacity of which may be neglected at the frequencies within the pass band.

Referring now to Fig. 1, the amplifier illustrated comprises two stages including a first stage electron discharge device 1 and a second stage electron discharge device 2. High frequency wave energy is supplied from a suitable source 3 and is impressed on a control electrode 4 of the device 1. The device 1 also includes an anode 5 and a cathode 6, the anode being connected to the positive terminal of a suitable source of direct current (not shown) through a resistance comprising elements 7 and 8 and the cathode being connected to ground through a resistance 9 bypassed by a capacitor 10. The output of the device 1 is connected to a control electrode or grid 11 of the device 2 through a capacitor 12 and across a reactor 13 tuned with the circuit capacities to a frequency in the desired band. The second stage is similar to the first stage and the device 2 includes an anode 14 connected to the positive terminal of the source of direct current through a resistance including elements 15 and 16, and a cathode 17 connected to ground through a resistance 18 and a bypass capacitor 19. The output of the device 1 impressed on the input of the device 2 is amplified by the device 2 and is then supplied to a suitable output circuit or utilization device 20 through a capacitor 21 and across a reactor 22 tuned with the circuit capacities to a frequency in the desired band. The anode-to-cathode circuit of the devices 1 and 2 thus both include two branches, one including the resistance elements and the source of direct current, and the other the tuned reactor.

Figure 2:
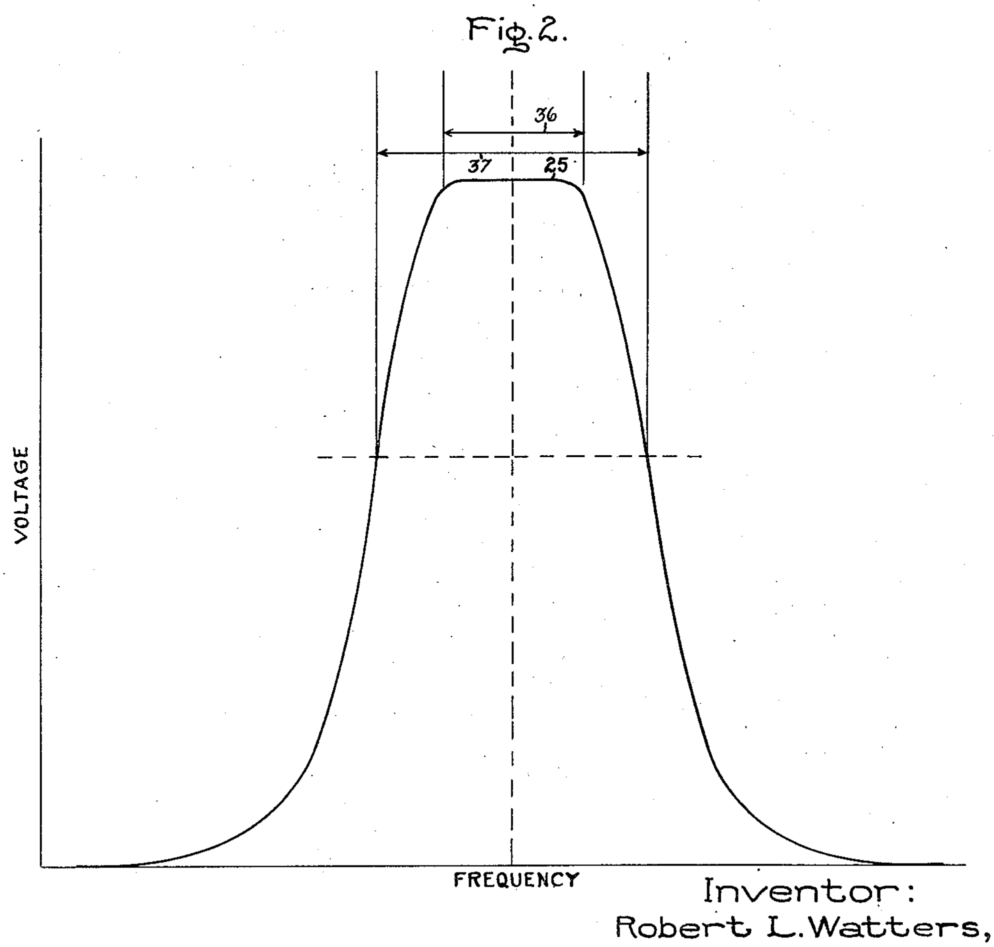
Figure 3:
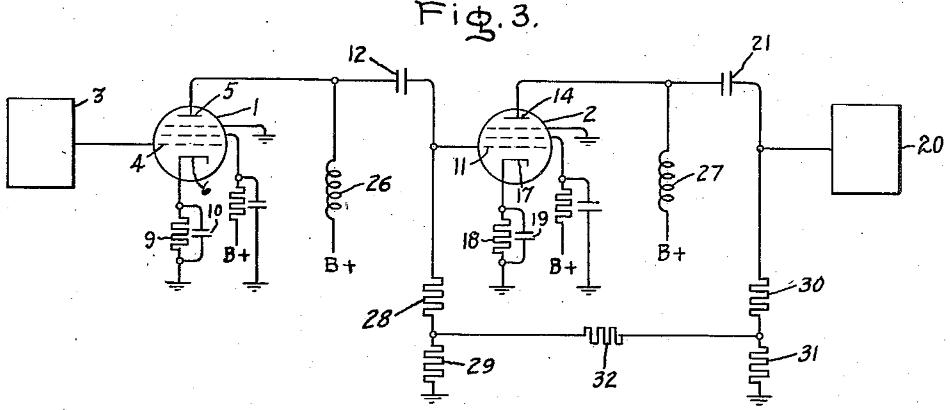

In order to obtain a flat-topped voltage-frequency characteristic such as that shown in Fig. 2, a feedback path is provided around the second stage of the amplifier. This provides a bidirectional coupling between the tuned reactors and renders the amplifier capable of a "flat"

or "double-humped" response characteristic. This characteristic can be obtained in the circuit of Fig. 1 by a direct resistance connection between the anodes 5 and 14; however, if a narrow pass band is required, increasing the value of this direct resistance conection to provide the required reduced feedback renders the reactance of the stray capacity of the feedback loop and associated circuitry comparable to the value of the increased direct resistance connection such that the circuit is unstable. In order to secure the flat response while maintaining stable operation a relatively high current low voltage feedback path is provided by connecting a resistance 23 between intermediate points on the anode resistances, the points selected in the circuit illustrated being the junction of the respective resistance elements 7—8 and 15—16. These constitute points of lower radio frequency potential than that available directly at the anodes such that a reduced amount of feedback is obtained. It should be noted that the impedances involved in this type of four terminal feedback network will always be lower than in arrangements involving a direct resistance connection between anodes, if the amount of feedback, and hence bandwidth, is to remain constant. The values of the elements of this resistance network are preferably selected to provide an equivalent resistance between the anodes 5 and 14 equal to that of the direct anode-to-anode connecting resistor required for the same narrow band; although the actual resistance, the sum of the resistances 7, 15 and 23 may be only a small fraction of that required for the direct connection. The relative values of resistances which can be employed satisfactorily by means of an H connection as illustrated to secure the low voltage feedback, as distinguished from the high voltage feedback using the $\pi$ type direct connection, can be determined by the well-known principles of $\pi$ and T equivalent circuits. When the low resistance connection is employed it has been found that the distributed capacities of the resistance elements of the feedback path may be neglected, and stable operation of the amplifier is secured throughout the selected band width.

A small adjustable capacitor 24 is connected between the anode 14 and the control electrode 11 in order to balance the small distributed capacities of the several resistances and leads in the feedback network; this balancing of capacity around the feedback loop renders the loop independent of frequency and eliminates a tendency of the characteristic to rise or "hump up" on the high frequency side. When the value of the capacitor 24 is properly adjusted the amplifier may be lined up at any frequency over the range of the tuning coils 13 and 22 while maintaining the desired flat-topped characteristic.

During the adjustment or "lining up" of the amplifier the band width may be changed by changing the gain on the device 2, and by reducing the gain to the point where a sharp response is obtained, it becomes easy to tune the two stages to the same frequency. Adjustments of band width may be made by changing the value of the feedback resistor 23, the greater the value of the resistor, the less the amount of feedback, and hence, the narrower the band width. Large changes in band width may require a change in the over-all plate load of the device 2. In the usual case the feedback circuit will be symmetrical, the resistance elements 7 and 15 being equal and also the elements 8 and 16.

During the operation of the amplifier of Fig. 1, energy at all frequencies within the narrow flat-topped portion of the characteristic as indicated at 25 in Fig. 2 is amplified without appreciable difference in gain of the amplifier.

The second embodiment of the invention as illustrated in Fig. 3 is similar to that of Fig. 1 and corresponding parts have been designated by the same numerals. The two embodiments differ in that the circuit of Fig. 3 is arranged with the feedback network and the tuned reactors interchanged in position with respect to their positions in Fig. 1. In Fig. 3 reactors 26 and 27 tuned with their respective circuit capacities are connected between the positive side of the source of direct current and the anodes 5 and 15 respectively. A resistance comprising elements 28 and 29 is connected between the control electrode 11 and ground, and a similar resistance comprising elements 30 and 31 is connected between the output terminal of the amplifier and ground; this output terminal is normally connected to the control electrode of the first electron discharge device of the device 20. The feedback path is obtained by connecting a resistance 32 between the junctures of the two elements of each resistance. This provides an H connection like that of Fig. 1 and makes it possible to employ resistances of sufficiently low value to render their distributed capacities negligible in the circuit.

The operation of the circuit of Fig. 3 is essentially the same as that of the amplifier of Fig 1. The arrangement of the circuit components in Fig. 1 is preferable for applications in which small recovery time after high amplitude signals is important. Such signals draw grid current and charge the capacitors 12 and 21 which are quickly discharged through the reactors 13 and 22 in Fig. 1, a longer time being required for the discharge of these capacitors in Fig. 3 through the resistances 28—29 and 30—31.

Figure 4:
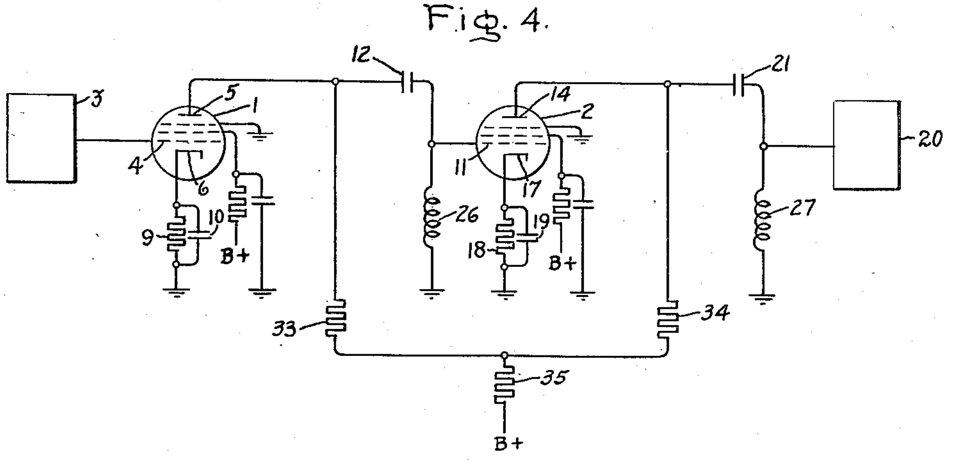

Fig. 4 illustrates an embodiment essentially the same as that of Fig. 1 and corresponding parts have been designated by the same numerals. In the amplifier of Fig. 1 if the feedback resistor is tapped far down on the plate resistors, that is, connected between points near the direct current source, the feedback network may be modified to provide a Y connection as shown in Fig. 4. Resistance elements 33 and 34 are connected to the anodes 5 and 14 respectively and their other ends are joined and connected to the source through a common resistance 35 which takes the place of the common resistance network including resistances 8, 23, and 16 of Fig. 1. The resistance 35 is small as compared with the resistance elements 33 and 34; however, satisfactory adjustment of the feedback can be obtained by adjusting this small resistance. It will thus be apparent that the feedback can be changed without appreciable influence on the effective loading of the tuned circuits and the adjustment to critical coupling can be made without appreciably affecting the band width. In those applications of the invention where the portion of the plate resistance between the feedback tap and the positive side of the direct current source is a substantial fraction of the total plate resistance, it is desirable to employ the arrangement of Fig. 1 because this allows adjustment to critical coupling by changing the feedback resistor 23 without affecting the band width.

It will readily be understood that the principle applied in Fig. 4 in changing the H connection of Fig. 1 to a Y connection may also be applied to the feedback network of Fig. 3.

All of the circuits illustrated may be adjusted to provide flat-topped characteristics such as illustrated in Fig. 2, it being understood that the true flatness of the top of the curve depends upon the nearness of the adjustment to critical coupling. It will readily be understood that in some applications it may be desirable to tune the circuits slightly off critical coupling in order to utilize a somewhat greater band width.

From the foregoing it is apparent that this invention provides a simple circuit arrangement for securing a flat-topped voltage-frequency characteristic for narrow band width operation at high frequencies, which circuit is stable throughout its range of operation. By way of illustration only and not by way of limitation, there are listed below values of circuit constants which have been found to be suitable for the circuit of Fig. 1 when employed as an intermediate frequency amplifier at frequencies of the order of 30 megacycles. The electron discharge devices 1 and 2 were type 1852 pentodes and the reactors 13 and 22 were tuned to 30 megacycles with their respective circuit capacities. A 270 volt direct current source was employed and the screen grid resistors were connected to a 90 volt tap on the source. The other values were as follows:

Capacitors 12 and 21, .0001 microfarad.
Capacitor 24, adjustable from .25 to 1.5 micromicrofarads.
Capacitors 10 and 19, .01 microfarad.
Resistances 9 and 18, 50 ohms.
Resistances 7 and 15, 2200 ohms.
Resistances 8 and 16, 1000 ohms.
Resistance 23, 680 ohms.

This amplifier operated to produce a characteristic as indicated in Fig. 2, the band width of the flat-topped portion indicated at 36 being 2.3 megacycles and the band width at the half power level, that is, at .707 full voltage, as indicated at 37, was 4.8 megacycles.

While particular embodiments of the invention have been illustrated, it will be understood that it is not intended that the invention be limited thereto since other modifications will occur to those skilled in the art. It is therefore intended by the appended claims to cover all modifications which fall within the spirit and scope of the invention.

What I claim as new and desire to secure by Letters Patent of the United States, is:

1. An electronic amplifier for wave energy within a predetermined narrow band of frequencies comprising first and second electron discharge devices each having an anode and a cathode and a control electrode, means connecting the anode of said first device and the control electrode of said second device, a first resistance element in an anode-to-cathode circuit of said first device, a second resistance element in a corresponding anode-to-cathode circuit of said second device, a first resonant circuit tuned to a frequency within said narrow band connected in a different anode-to-cathode circuit of said first device, a second resonant circuit tuned to a frequency within said narrow band and connected in a different anode-to-cathode circuit of said second device, resistance means common to both said circuits and connected to corresponding ends of said first and second elements remote from said devices for providing a low voltage, high current, feedback path between the output of said second device and the control electrode thereof to provide a flat-topped voltage-frequency characteristic, the values of said resistance means and said resistance elements being such as to provide a low resistance feedback path having negligible distributed capacity within said band of frequencies.

2. An electronic amplifier for wave energy within a predetermined narrow band of high frequencies comprising an electron discharge device having an anode and a cathode and a control electrode, a non-frequency responsive circuit including a first resistor for impressing on said control electrode wave energy within said band, a second resistor connected in a circuit between said anode and said cathode, a resonant circuit tuned to a frequency within said narrow band and connected in a different circuit between said anode and cathode, and a third resistor connected between a point intermediate the ends of said second resistor and a point intermediate the ends of said first resistor for providing a low voltage, high current, feedback path between said anode and said control electrode to provide a flat-topped voltage-frequency characteristic, said intermediate points being located so that said third resistor has a low resistance and its distributed capacity is negligible within said band of frequencies.

3. An electronic amplifier for wave energy within a predetermined narrow band of high frequencies comprising an electron discharge device having an anode and a cathode and a control electrode, a non-frequency responsive circuit including a first resistor for impressing on said control electrode wave energy within said band, a source of direct current, a second resistor connected between said anode and said source, a resonant circuit tuned to a frequency within said narrow band connected in a different circuit between said anode and said cathode, and a third resistor connected between a point intermediate the ends of said second resistor and a point intermediate the ends of said first resistor for providing a low voltage, high current, feedback path between said control electrode and said anode to provide a flat-topped voltage-frequency characteristic, said intermediate points being located so that said third resistor has a low resistance and its distributed capacity is negligible within said band of frequencies.

4. An electronic amplifier for wave energy within a predetermined narrow band of high frequencies comprising an electron discharge device having an anode and a cathode and a control electrode, a first circuit tuned to a frequency within said band associated with said control electrode, a second circuit tuned to a frequency within said band associated with said anode, said circuits being tuned to a predetermined frequency within said band, a non-frequency responsive circuit including a first resistor for impressing on said control electrode wave energy within said band, a second resistor connected in a circuit between said anode and said cathode, and a third resistor connected between a point intermediate the ends of said second resistor and a point intermediate the ends of said first resistor for providing a low voltage, high current, feedback path between said control electrode and said anode to provide a flat-topped voltage-frequency characteristic, said intermediate points being located so that said third resistor has a low resistance and its distributed capacity is negligible within said band of frequencies.

5. An electronic amplifier for wave energy within a predetermined narrow band of frequencies comprising first and second electron discharge devices each having an anode and a cathode and a control electrode, means connecting the anode of said first device and the control electrode of said second device, a non-frequency responsive circuit including a first resistor in the anode-to-cathode circuit of said first device, a second resistor in the anode-to-cathode circuit of said second device, a first resonant circuit tuned to a frequency within said band connected in a different anode-to-cathode circuit of said first device, a second resonant circuit tuned to a frequency within said band and connected to a different anode-to-cathode circuit of said second device, and a third resistor connected between a point intermediate the ends of said second resistor and a point intermediate the ends of said first resistor for providing a feedback path between said control electrode of said second device and said anode thereof to provide a flat-topped voltage-frequency characteristic, said intermediate points being located so that said third resistor has a low resistance and its distributed capacity is negligible within said band of frequencies.

6. An electronic amplifier for wave energy within a predetermined narrow band of frequencies comprising first and second electron discharge devices each having an anode and a cathode and a control electrode, means connecting the anode of said first device and the control electrode of said second device, first and second tuned circuits associated with the anodes of said first and second devices respectively and tuned to a predetermined frequency within said band, a non-frequency responsive circuit comprising a first resistance element in an anode-to-cathode circuit of said first device, a second resistance element in a corresponding anode-to-cathode circuit of said second device, and resistance means common to both said anode-to-cathode circuits and connected to corresponding ends of said first and second elements remote from said devices for providing a feedback path between the output of said first device and the control electrode thereof to provide a flat-topped voltage-frequency characteristic, the values of said resistance means and said resistance elements being such as to provide a low voltage, high current, feedback path the distributed capacity of which is negligible within said band of frequencies.

7. An electronic amplifier for wave energy within a predetermined narrow band of frequencies comprising first and second electron discharge devices each having an anode and a cathode and a control electrode, means for impressing wave energy within said band on the control electrode of said first device, means connecting the anode of said first device and the control electrode of said second device, a source of direct current, a non-frequency responsive circuit comprising a first resistor connected in an anode-to-cathode circuit of said first device between the anode thereof and said source, a second resistor connected in an anode-to-cathode circuit of said second device between the anode thereof and said source, tuned circuits connected respectively between the anodes and cathodes of said devices and tuned to a predetermined frequency in said band, and a third resistor connected between a point intermediate the ends of said second resistor and a point intermediate the ends of said first resistor for providing a low voltage, high current, feedback path between the anode of said second device and the control electrode thereof to provide a flat-topped voltage-frequency characteristic, said intermediate points being located so that said third resistor has a low resistance and its distributed capacity negligible within said band of frequencies.

8. An electronic amplifier for wave energy within a predetermined narrow band of frequencies comprising first and second electron discharge devices each having an anode and a cathode and a control electrode, means connecting the anode of said first device and the control electrode of said second device, a non-frequency responsive circuit comprising a first resistor in the anode-to-cathode circuit of said first device, a second resistor in the anode-to-cathode circuit of said second device, a first resonant circuit tuned to a frequency within said band and connected in a different anode-to-cathode circuit of said first device, a second resonant circuit tuned to a frequency within said band and connected in a different anode-to-cathode circuit of said second device, and a third resistor connected between a point intermediate the ends of said second resistor and a point intermediate the ends of said first resistor to complete a feedback loop for providing a low voltage, high current, feedback path between the anode of said second device and the control electrode thereof to provide a flat-topped voltage-frequency characteristic, and a capacitance connected between the anode and control electrode of said second device for balancing the capacities around said feedback loop.

9. An electronic amplifier for wave energy within a predetermined narrow band of frequencies comprising first and second electron discharge devices each having an anode and a cathode and a control electrode, means for impressing wave energy within said band on the control electrode of said first device, means connecting the anode of said first device and the control electrode of said second device, a source of direct current, a first resistor connected in an anode-to-cathode circuit of said first device between the anode thereof and said source, a second resistor connected in an anode-to-cathode circuit of said second device between the anode thereof and said source, resonant circuits connected respectively between the anodes and cathodes of said devices and tuned to a predetermined frequency within said band, and means comprising a non-frequency responsive feedback path of low resistance and negligible distributed capacity for frequencies within said band coupled between intermediate points of said resistors to provide a flat-topped voltage-frequency characteristic within said band of frequencies.

10. A narrow band amplifier comprising an electron discharge device, said device comprising an anode, cathode, and a control electrode, means for energizing the electron discharge path of said device with a unidirectional potential, means for tuning said amplifier to a predetermined frequency comprising a tuned circuit coupled to said device and resonant within the pass band of said amplifier, means for providing a substantially flat top, narrow band response for said amplifier comprising a feedback circuit, said feedback circuit having a pair of input terminals connected between said anode and cathode and a pair of output terminals connected between said control electrode and cathode, a resistance connected between said input terminals, resistance connected between said output terminals, means connecting intermediate points on said resistances, said points being selected to provide a relatively low resistance feedback path at the frequencies of said band as compared to the stray capacitive reactance of said feedback network at the frequencies of said band.

11. A narrow band amplifier arrangement comprising an electron discharge device, said device comprising an input and an output electrode, means for energizing the electron discharge path of said device with a unidirectional potential, means for tuning said amplifier comprising a circuit resonant to a frequency within said band connected to one of said electrodes, means for providing a substantially flat top, narrow band response for said amplifier comprising a feedback circuit, said feedback circuit comprising a pair of input and output terminals, a resistor connected across one pair of terminals, a resistor connected across the other pair of terminals, means connecting intermediate points on said resistors, said points being selected to provide a low resistance feedback path as compared to the reactance of the feedback path stray capacity at the frequencies of said band.

12. A band-pass signal amplifier comprising an electron-discharge device including an anode, a cathode and a control electrode, anode-cathode and control electrode-cathode circuits for said device, means for resonating one of said anode-cathode and control electrode-cathode circuits at a frequency within an operating band of frequencies for said amplifier, a first resistance included in said anode-cathode circuit and having one terminal coupled to said anode, a second resistance included in said control electrode-cathode circuit and having one terminal coupled to said control electrode, and a coupling circuit extending between the remaining terminals of said first and second resistances and having a third resistance effectively in series circuit relation with each of said first and second resistances and coupled to said cathode, said first and second resistances and said coupling circuit constituting a non-frequency responsive, low voltage-high current, feedback network for said amplifier.

ROBERT L. WATTERS.

REFERENCES CITED

The following references are of record in the file of this patent:

UNITED STATES PATENTS

| Number | Name | Date |
|---|---|---|
| 2,189,849 | Wheeler | Feb. 13, 1940 |
| 2,300,133 | Nyquist | Oct. 27, 1942 |
| 2,313,014 | Hagen | Mar. 2, 1943 |
| 2,335,496 | Foster et al. | Nov. 30, 1943 |
| 2,498,561 | Lipkin | Feb. 21, 1950 |